(12) United States Patent
Gesche

(10) Patent No.: US 9,210,792 B2
(45) Date of Patent: Dec. 8, 2015

(54) METHOD AND APPARATUS FOR GENERATING PLASMA PULSES

(71) Applicant: Forschungsverbund Berlin e.V., Berlin (DE)

(72) Inventor: Roland Gesche, Seligenstadt (DE)

(73) Assignee: Forschungsverbund Berlin E.V., Berlin (DE)

( * ) Notice: Subject to any disclaimer, the term of this patent is extended or adjusted under 35 U.S.C. 154(b) by 81 days.

(21) Appl. No.: 13/746,784

(22) Filed: Jan. 22, 2013

(65) Prior Publication Data

US 2013/0187544 A1 Jul. 25, 2013

(30) Foreign Application Priority Data

Jan. 23, 2012 (DE) .......................... 10 2012 200 878

(51) Int. Cl.
*H05H 1/46* (2006.01)
*H05H 1/48* (2006.01)

(52) U.S. Cl.
CPC ... *H05H 1/46* (2013.01); *H05H 1/48* (2013.01)

(58) Field of Classification Search
CPC ....... H05H 1/46; H05H 1/48; H01J 37/32082; H01J 37/32192; H01J 37/32935
USPC ............... 315/111.21, 111.01, 108, 112, 344, 315/348, 360; 313/231.31; 330/124 R
See application file for complete search history.

(56) References Cited

U.S. PATENT DOCUMENTS

| | | | |
|---|---|---|---|
| 5,932,116 A * | 8/1999 | Matsumoto et al. | 219/121.57 |
| 2002/0160125 A1 * | 10/2002 | Johnson et al. | 427/569 |
| 2003/0174526 A1 | 9/2003 | Mark | |
| 2004/0163762 A1 * | 8/2004 | Iizuka et al. | 156/345.39 |
| 2004/0242021 A1 | 12/2004 | Kraus et al. | |
| 2008/0272700 A1 | 11/2008 | Lin et al. | |
| 2009/0308734 A1 * | 12/2009 | Krauss | 204/192.13 |

FOREIGN PATENT DOCUMENTS

| | | |
|---|---|---|
| DE | 92 10 382 U1 | 9/1992 |
| DE | 100 18 879 A1 | 10/2001 |
| EP | 0 503 082 A1 | 9/1992 |
| EP | 0 674 369 B1 | 6/2002 |
| WO | 2006/119379 A1 | 11/2006 |

OTHER PUBLICATIONS

European Search Report for corresponding EP Application No. EP 13152319 dated Apr. 28, 2014.

* cited by examiner

*Primary Examiner* — Dylan White

(74) *Attorney, Agent, or Firm* — Norris McLaughlin & Marcus, P.A.

(57) ABSTRACT

A method and apparatus generates pulses that can be used for high-precision three-dimensional plasma treatment. At least two sources are furnished with at least one time function, wherein each of the at least two sources radiates an electromagnetic field generated by one of the time functions, and the at least one time function. In a method, the at least two sources cooperate in such a manner that at least one predetermined field strength is realized sequentially in a temporal succession in at least two predetermined space-time points. An alternative method uses at least one source and at least one reflection element. An apparatus with at least two sources and at least one data processing device or at least one source, at least one reflection element and at least one data processing device is configured such that one of the methods can be executed.

9 Claims, 1 Drawing Sheet

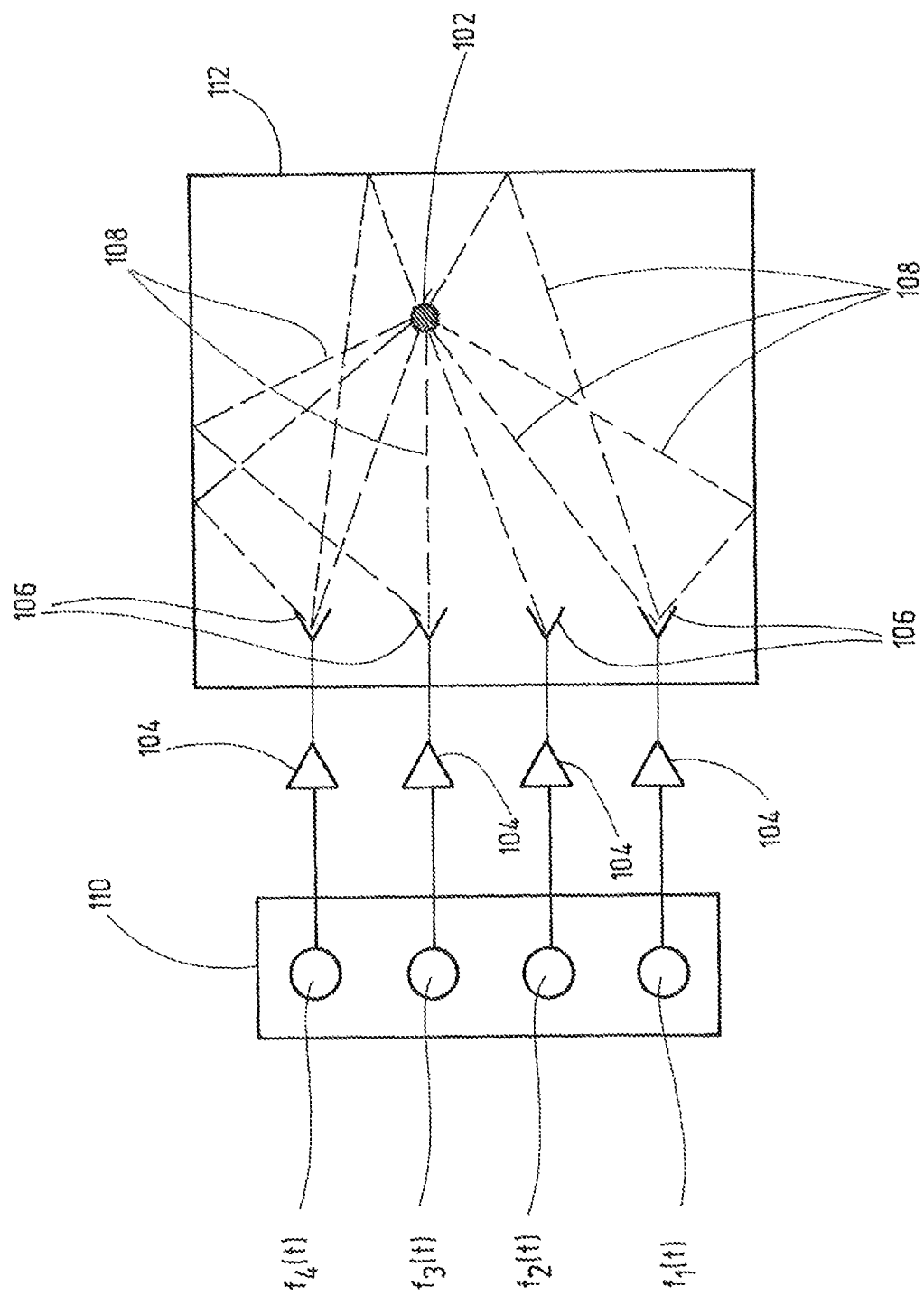

METHOD AND APPARATUS FOR GENERATING PLASMA PULSES

BACKGROUND OF THE INVENTION

1. Field of the Invention

The invention relates to a method and an apparatus for generating plasma pulses that can be used for high-precision three-dimensional plasma treatment in particular.

2. Description of Related Art

There is a wide variety of low-temperature plasma applications in a multitude of different configurations in the low-pressure range or at atmospheric pressure, wherein an ever-recurring problem consists in obtaining a desired spatial distribution or uniformity of the plasma or the products thereof. In particular, this problem occurs when large-surface workpieces or three-dimensional shapes are to be treated.

A method for the focusing of microwaves in a spatial position in the field of medicine is known from Publication No. WO 2006/119379 A1. According to that method, an antenna radiates a microwave toward the region to be treated. The signals reflected from said region are received by further antennas of an antenna array and analyzed by an analyzing unit. For the purpose of treating said region, the time-inverted microwaves are radiated by the antenna array. A disadvantage of that solution consists in the fact that it is only suitable for the treatment of static regions.

Furthermore, in the field related to the present invention, a power supply device for bipolar power supply is known from German Published Patent Application No. DE 100 18 879 A1. The power supply device comprises two switching units, by means of which output pulses having a predeterminable amplitude, having a predeterminable pulse duration and having a predeterminable interval between pulses can be generated. DE 100 18 879 A1 does not describe any superposition of the output pulses for generating a predeterminable local field strength. Rather, a geometrical development of the plasma is achieved by a special arrangement of the electrodes.

A circuit arrangement for a power supply device for devices and plants for plasma technology and surface engineering is described in Utility Model No. DE 92 10 382 U1. The distribution of the plasma is optimized by controlling the output pulses. DE 92 10 382 U1 is about an extensive volume plasma but not about local plasma excitation.

U.S. Pat. No. 5,932,116 A relates to a power supply for pulse output by several electrodes. According to that publication, the electrodes are activated sequentially and do not jointly act on a local point of treatment.

European Patent Specification No. EP 0 674 369 B1 relates to a gas laser with microwave excitation, wherein a gas medium is excited by a multitude of microwaves in such a manner that it reaches a high energy state, wherein the directions of the oscillations of the electric field of the microwaves differ from each other. Furthermore, the microwaves have pulse microwaves synchronized by the gas laser.

A device for the generation of microwave plasma is disclosed in European Patent Application No. EP 0 503 082 A1. The device radiates microwaves into a discharge space in order to generate plasma in a wide area in fixed positions and over a long period of time. To this end, microwave pulses are continuously outputted at various time intervals by a multitude of microwave transmitters.

BRIEF SUMMARY OF THE INVENTION

Therefore, the object of the invention consists in providing a method and an arrangement for generating plasma pulses that eliminate the disadvantages of the known solutions and, in particular, make three-dimensionally controllable plasma treatment possible.

A particular advantage of the invention consists in the fact that it is also possible to treat large-surface workpieces or three-dimensional shapes with high precision by realizing a temporal and spatial constructive superposition of electromagnetic fields, which is achieved by furnishing, in the inventive method for generating plasma pulses, at least two sources of electromagnetic fields with at least one time function so that each of the at least two sources radiates an electromagnetic field modulated by the at least one time function. In particular, said sources are provided in the form of antennas. The at least two sources are arranged in a particular configuration, and the at least one time function is designed in such a manner that the electromagnetic fields radiated by the sources superpose in such a manner that a predetermined superposition pattern is formed. In particular, the invention provides that the electromagnetic field resulting from said superposition realizes a predetermined field strength in predetermined spatial positions and at predetermined times. In the following, a quadruple composed of three spatial coordinates and one time value is also referred to as a space-time point.

A preferred embodiment provides that at least two sources are furnished with at least one time function and each of the at least two sources radiates an electromagnetic field generated by one of the time functions, wherein the at least one time function and the at least two sources cooperate in such a manner that a localized plasma pulse is generated in at least one predetermined space-time point by realizing a predetermined field strength in the predetermined space-time point.

It may be provided that at least a part of the sources is furnished with the same time function and/or at least a part of the sources is furnished with various time functions.

A preferred embodiment provides that each of at least a part of the predetermined space-time points is reached by at least one of the time functions in various directions of propagation, which can take place in the form of, e.g., a reflection of at least one time function by one or several reflection elements.

Therefore, an alternative embodiment of the invention provides that the number of sources is reduced and at least one source is furnished with at least one time function. The at least one source radiates an electromagnetic field modulated by the at least one time function. According to this inventive alternative embodiment, one or several reflection elements are designed and placed in such a manner that at least one predetermined field strength is realized in at least one predetermined space-time point by superimposing reflected parts of the electromagnetic field (which is radiated by the at least one source) upon the electromagnetic field. A preferred embodiment provides that the reflection elements are parts of a treatment chamber, e.g., that they are constituted by at least a part of the walls of the treatment chamber.

A preferred embodiment provides that at least one source is furnished with a time function and the at least one source radiates an electromagnetic field generated by the time function, wherein the time function, the at least one source and at least one reflection element cooperate in such a manner that, by superimposing reflected parts of the radiated electromagnetic field upon the electromagnetic field, a localized plasma pulse is generated in at least one predetermined space-time point by realizing a predetermined field strength in the predetermined space-time point.

A further preferred embodiment provides that the frequency and/or the amplitude of at least a part of the time functions change/s temporally, thus achieving a temporal change in the superposition pattern and thus a successive generation of a multitude of individual plasma pulses having predetermined field strengths in various places of the (three-dimensional) space, wherein the field strength may vary and have various values in at least a part of the various places. In this manner, it is also possible to generate complex one-, two- or three-dimensional spatial structures or patterns, e.g., for a treatment of materials. In particular, this embodiment provides that one or several plasma pulses are generated sequentially in a temporal succession in various spatial target places.

Another preferred embodiment provides that at least a part of the time functions is determined by outputting a pulse in the spatial target places, i.e., in those places in which a plasma pulse having a predetermined field strength is to be generated, said outputted pulse having a corresponding field strength. The response of said outputted pulse is recorded in the places of the source/s. Thus, a time function is recorded for at least a part of the sources (preferably, for each source). In order to generate the plasma pulse in the target place, the time functions determined in this manner are (re)radiated by the source/s in a time-inverted manner. In this manner, plasma pulses can be obtained also in complex environments, e.g., for reflection elements arranged in a complex manner. Alternatively, the time functions can be calculated directly or obtained by means of simulation.

An inventive apparatus for generating plasma pulses comprises at least two sources of electromagnetic waves and at least one data processing device. According to the invention, the apparatus is configured in such a manner that the at least two sources are furnished with at least one time function, wherein each of the at least two sources radiates an electromagnetic field modulated by the at least one time function. The arrangements of the at least two sources and of the at least one time function are coordinated with each other in such a manner that a plasma pulse having a predetermined field strength is generated in at least one predetermined place in the three-dimensional space at a predetermined time (predetermined space-time point). Preferably, a localized plasma pulse is generated by realizing a predetermined field strength in the predetermined space-time point.

A preferred embodiment provides that the apparatus furthermore comprises at least one reflection element, from which the electromagnetic waves radiated by at least a part of the at least two sources are reflected. In this case, the at least two sources, the at least one reflection element and the at least one time function cooperate in such a manner that a plasma pulse having a predetermined field strength is generated in at least one predetermined space-time point. If the at least one reflection element is used, it will do if the apparatus comprises only at least one source and at least one data processing device aside from the at least one reflection element in order to generate the plasma pulse having a predetermined field strength.

Preferably, at least a part of the sources is in the form of antennas. A preferred embodiment provides that also the pulse that is outputted in order to determine the at least one part of the time functions is outputted by an antenna.

A further preferred embodiment provides that the apparatus furthermore comprises a treatment chamber. Preferably, at least a part of the walls of the treatment chamber is in the form of a reflection element. Preferably, at least a part of the interior walls of the treatment chamber has a metallic surface.

In further preferred embodiments, the apparatus is configured in such a manner that the procedure steps explained in the description can be executed.

An inventive computer program enables a data processing device, after the loading of the computer program into the storage of the data processing device, to execute a method for generating plasma pulses, wherein at least two sources are furnished with at least one time function, each of the at least two sources radiates an electromagnetic field generated by one of the time functions, and the at least one time function and the at least two sources cooperate in such a manner that at least one predetermined field strength is realized sequentially in a temporal succession in at least two predetermined space-time points.

An alternative inventive computer program enables a data processing device, after the loading of the computer program into the storage of the data processing device, to execute a method for generating plasma pulses, wherein at least one source is furnished with a time function, the at least one source radiates an electromagnetic field generated by the time function, and the time function, the at least one source and at least one reflection element cooperate in such a manner that, by superimposing reflected parts of the radiated electromagnetic field upon the electromagnetic field, at least one predetermined field strength is realized in at least one predetermined space-time point.

For example, such computer programs can be provided (at a charge or free of charge, freely accessibly or with password protection) in a data or communications network, from which they can be downloaded. The computer programs provided in this manner can then be utilized by a method in which a computer program is downloaded from an electronic data network (e.g., from the Internet) to a data processing device connected to the data network.

The invention provides for the use of a machine-readable storage medium in order to execute the inventive method. In said storage medium, a program is stored that enables a data processing device, after the loading of the program into the storage of the data processing device, to execute a method for generating plasma pulses, wherein at least two sources are furnished with at least one time function, wherein each of the at least two sources radiates an electromagnetic field generated by one of the time functions, and the at least one time function and the at least two sources cooperate in such a manner that at least one predetermined field strength is realized sequentially in a temporal succession in at least two predetermined space-time points.

Alternatively, a machine-readable storage medium is provided, in which a program is stored that enables a data processing device, after the loading of the program into the storage of the data processing device, to execute a method for generating plasma pulses, wherein at least one source is furnished with a time function, the at least one source radiates an electromagnetic field generated by the time function, and the time function, the at least one source and at least one reflection element cooperate in such a manner that, by superimposing reflected parts of the radiated electromagnetic field upon the electromagnetic field, at least one predetermined field strength is realized in at least one predetermined space-time point. Preferably, a localized plasma pulse is generated by realizing a predetermined field strength in the predetermined space-time point.

In particular, the invention provides that the at least one time function is generated by the data processing device. Preferably, the data processing device is a controller.

Thus, the invention solves the problem of obtaining a desired spatial distribution (in particular, a uniform distribution) of plasma. Said problem is solved by generating individual, temporally short and sharply localized plasma pulses by electric fields, wherein the intensity and localization of said plasma pulses can be controlled by an inventive electrical power supply device. A multitude of such individual pulses is generated successively. The sum of said individual pulses forms a three-dimensionally controllable plasma treatment.

This concept can also be used for applications other than plasma excitation, where a treatment effect is generated by high local field strengths, e.g., for heating materials up.

BRIEF DESCRIPTION OF THE DRAWINGS

In the following, the invention will be explained in greater detail on the basis of an exemplary embodiment with reference to the drawing, in which FIG. 1 shows a basic illustration of an exemplary method for generating plasma pulses.

DETAILED DESCRIPTION OF THE INVENTION

In the following, the invention will be described in greater detail on the basis of an exemplary embodiment with four sources in the form of antennas and with a treatment chamber whose walls act as reflection elements. However, we would like to emphasize that the invention is not limited to this special exemplary embodiment but also comprises methods and apparatuses that comprise a different number of antennas (in particular, one antenna only). Likewise, the invention also comprises methods and apparatuses that use a different number of reflection elements or differently designed reflection elements or have no reflection element.

The core of the invention consists in the temporal and spatial superposition of electromagnetic fields that generate a pulse at a spatial target point 102 at a desired time, said pulse having desired field strength. One or several power amplifiers 104 and antennas 106 output time functions, which reach the target point 102 on one or various propagation paths 108.

According to the exemplary embodiment, four time functions $f_1(t)$, $f_2(t)$, $f_3(t)$ and $f_4(t)$ are generated by a controller 110. The time functions $f_1(t)$, $f_2(t)$, $f_3(t)$ and $f_4(t)$ may be temporally modulated carrier frequencies. These signals are amplified by the power amplifiers 104 and radiated via the antennas in a treatment chamber 112. In the exemplary embodiment, the treatment chamber 112 is in the form of a chamber having metallic walls. The metallic walls of the treatment chamber 112 reflect the electromagnetic waves, which results in a multitude of propagation paths 108 that result, with suitable time functions $f_1(t)$, $f_2(t)$, $f_3(t)$ and $f_4(t)$, in the desired superposition.

For example, an additional antenna may be arranged at the target point 102 in the treatment chamber 112 for the purpose of determining the time functions $f_1(t)$, $f_2(t)$, $f_3(t)$ and $f_4(t)$. A pulse having desired field strength is outputted via the additional antenna, and the response is recorded by the antennas 106. If the controller 110 generates this pulse response in a time-inverted manner, the original pulse is formed at the target point 102. This method is known as time inversion and is used, e.g., in the field of acoustics or in the field of medical engineering.

The embodiments of the invention are not limited to the above-mentioned preferred exemplary embodiments. Rather, a number of variants are possible that use the inventive apparatus, the inventive method and the inventive machine-readable storage medium also in fundamentally different embodiments.

The invention claimed is:

1. A method for generating plasma pulses, wherein
at least two sources of which each is furnished with at least one corresponding time function, wherein
each of the at least two sources radiates an electromagnetic field generated by the at least one corresponding time function, and
the at least one corresponding time functions and the at least two sources cooperate in such a manner that a constructive temporal and spatial superposition of the radiated electromagnetic fields of at least one predetermined field strength is realized sequentially in a temporal succession in at least two predetermined space-time points, wherein the at least two predetermined space-time points correspond to different locations in three dimensional space.

2. The method according to claim 1, wherein the at least one predetermined space-time point is reached by at least one of the time functions on at least two different propagation paths.

3. The method according to claim 1, wherein the predetermined space-time points form a one-, two- or three-dimensional structure.

4. The method according to claim 1, wherein at least one time function is determined by outputting a predetermined pulse in a space point and recording said pulse as a pulse response in the places of the at least two sources.

5. The method according to claim 1, wherein at least one source is furnished with the time-inverted pulse response.

6. A method for generating plasma pulses, wherein
at least one source is furnished with a time function, wherein
the at least one source radiates an electromagnetic field generated by the time function and
the time function, the at least one source and at least one reflection element cooperate in such a manner that, by constructive temporal and spatial superposition of reflected parts of the radiated electromagnetic field upon the electromagnetic field, at least one predetermined field strength is realized sequentially in a temporal succession in at least two predetermined space-time points, wherein the at least two predetermined space-time points correspond to different locations in three dimensional space.

7. The method according to claim 6, wherein the predetermined space-time points form a one-, two- or three-dimensional structure.

8. The method according to claim 6, wherein at least one time function is determined by outputting a predetermined pulse in a space point and recording said pulse as a pulse response in the places of the at least two sources.

9. The method according to claim 6, wherein at least one source is furnished with the time-inverted pulse response.

* * * * *